US011095252B1

(12) United States Patent
Zhao et al.

(10) Patent No.: US 11,095,252 B1
(45) Date of Patent: Aug. 17, 2021

(54) MIXER CIRCUITRY WITH NOISE CANCELLATION

(71) Applicant: Apple Inc., Cupertino, CA (US)

(72) Inventors: Feng Zhao, San Jose, CA (US); Utku Seckin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/026,056

(22) Filed: Sep. 18, 2020

(51) Int. Cl.
*H04B 1/26* (2006.01)
*H03D 7/14* (2006.01)
*H04B 15/00* (2006.01)
*H03B 5/12* (2006.01)
*H04B 1/10* (2006.01)

(52) U.S. Cl.
CPC .......... *H03D 7/1466* (2013.01); *H03B 5/1265* (2013.01); *H03D 7/1458* (2013.01); *H04B 1/10* (2013.01); *H04B 15/005* (2013.01)

(58) Field of Classification Search
CPC .. H03D 7/1466; H03D 7/1475; H03D 7/1491; H03D 7/165; H03D 7/1458; H04B 1/10; H04B 15/005
See application file for complete search history.

(56) References Cited

U.S. PATENT DOCUMENTS

| | | | |
|---|---|---|---|
| 6,987,425 B1 | 1/2006 | Sutardja | |
| 7,518,458 B2 | 4/2009 | Nakamura et al. | |
| 7,768,792 B2 | 8/2010 | Kim et al. | |
| 8,258,877 B2 | 9/2012 | Goel et al. | |
| 8,498,605 B1 | 7/2013 | Cook et al. | |
| 8,543,055 B1 | 9/2013 | Cook et al. | |
| 8,854,094 B2 | 10/2014 | Shin | |
| 8,977,222 B2 | 3/2015 | Mikhemar et al. | |
| 9,148,186 B1 | 9/2015 | Wu et al. | |
| 10,291,214 B2 | 5/2019 | Thijssen et al. | |
| 10,425,120 B2 | 9/2019 | Haine et al. | |
| 10,608,583 B2 | 3/2020 | Taghivand et al. | |
| 2007/0218851 A1* | 9/2007 | Soe | H04B 1/403 455/209 |
| 2013/0010977 A1* | 1/2013 | Hirano | H04B 15/005 381/71.4 |
| 2016/0285567 A1* | 9/2016 | Alam | H03D 7/1466 |

OTHER PUBLICATIONS

Mirzaei et al., Analysis and Optimization of Current-Driven Passive Mixers in Narrowband Direct-Conversion Receivers, IEEE Journal of Solid-State Circuits, vol. 44, No. 10, Oct. 2009.

* cited by examiner

*Primary Examiner* — Tuan Pham
(74) *Attorney, Agent, or Firm* — Treyz Law Group; Jason Tsai

(57) ABSTRACT

An electronic device may include wireless circuitry with a baseband processor, a transceiver, a front-end module, and an antenna. The transceiver may include mixer circuitry. The mixer circuitry may include switches controlled by oscillator signals. The mixer circuitry may also include oscillator phase noise cancelling capacitors controlled by inverted oscillator signals. Operated in this way, the mixer circuitry exhibits improved noise figure performance.

20 Claims, 11 Drawing Sheets

MIXER CIRCUITRY WITH NOISE CANCELLATION

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive radio-frequency signals.

Signals received by the antennas are fed through a transceiver, which often includes a mixer for demodulating the radio-frequency signals. It can be challenging to design a satisfactory mixer for an electronic device.

SUMMARY

An electronic device may include wireless communications circuitry. The wireless communications circuitry may include an antenna, a transceiver configured to receive radio-frequency signals from the antenna and to generate corresponding baseband signals, and a baseband processor configured to receive the baseband signals from the transceiver.

An aspect of the disclosure provides mixer circuitry. The mixer circuitry can include an input port configured to receive a radio-frequency signal from the antenna, an output port on which a baseband signal is generated based on the radio-frequency signal, an oscillator configured to generate a first oscillator signal, a second oscillator signal different than the first oscillator signal, and an third oscillator signal that is inverted with respect to the second oscillator signal, a first switch having a input terminal coupled to the input port, an output terminal coupled to the output port, and a control terminal configured to receive the first oscillator signal, a second switch having an input terminal coupled to the output terminal of the first switch, an output terminal coupled to the output port, and a control terminal configured to receive the second oscillator signal, and an oscillator phase noise cancellation capacitor having a first terminal coupled to the input terminal of the second switch and a second terminal configured to receive the third oscillator signal. The oscillator phase noise cancellation capacitor can be a metal-oxide-semiconductor capacitor, a metal-insulator-metal capacitor, or a metal-oxide-metal capacitor.

An aspect of the disclosure provides a method of operating a mixer. The method can include using an input port to receive a radio-frequency signal, using an oscillator to generate a first oscillator signal, a second oscillator signal different than the first oscillator signal, and a third oscillator signal that is inverted with respect to the second oscillator signal, using a first switch to receive the radio-frequency signal from the input port and to receive the first oscillator signal, using a second switch to receive signals from the first switch, to receive the second oscillator signal, and to generate a corresponding baseband signal based on the radio-frequency signal, and using a oscillator phase noise canceller to receive the third oscillator signal and to reduce a phase noise associated with second oscillator signal. The method can also include using a flip-flop to generating a first output signal and a second output signal, using a first series of buffers to receive the first output signal and to generate the first oscillator signal, and using a second series of buffers to receive the second output signal and to generate the second oscillator signal.

An aspect of the disclosure provides an electronic device that includes an antenna configured to receive radio-frequency signals, a baseband processor configured to receive baseband signals generated based on the radio-frequency signals, an oscillator configured to generate oscillator signals and inverted oscillator signals that are inverted with respect to the oscillator signals, and a mixer configured to receive the radio-frequency signals from the antenna and to generate the baseband signals. The mixer can include transistors with gate terminals configured to receive the oscillator signals and capacitors with first terminals directly connected to the transistors and second terminals configured to receive the inverted oscillator signals. The oscillator can include a flip-flop having a first output and a second output, a first plurality of buffers coupled to the first output and configured to generate a first of the oscillator signals, and a second plurality of buffers coupled to the second output and configured to generate a second of the oscillator signals. The oscillator can further include a first inverter coupled to a final buffer in the first plurality of buffers and a second inverter coupled to a final buffer in the second plurality of buffer. The first inverter can be configured to generate a first of inverted oscillator signals. The second inverter can be configured to generate a second of inverted oscillator signals.

DETAILED DESCRIPTION

Figure 1:
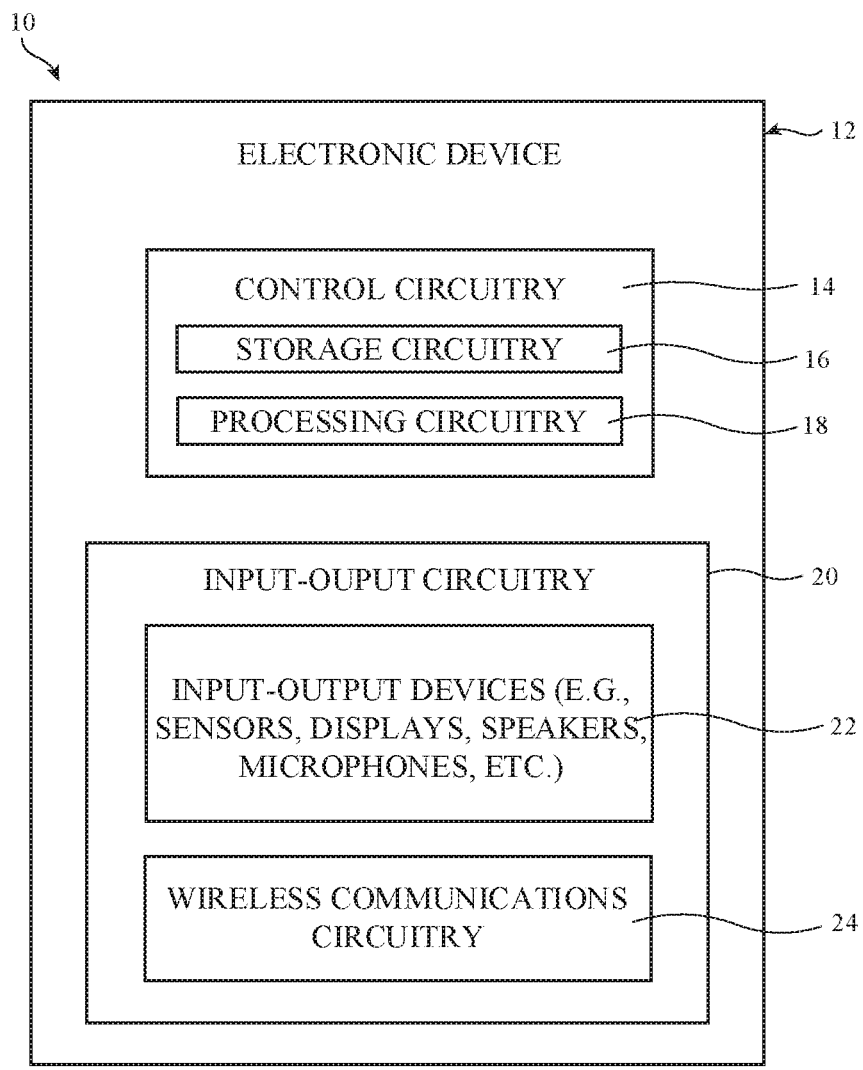
FIG. 1 is a diagram of an illustrative electronic device having wireless communications circuitry in accordance with some embodiments.

An electronic device such as electronic device 10 of FIG. 1 may be provided with wireless circuitry. The wireless circuitry may include passive mixer circuitry for down-converting radio-frequency signals to baseband. The passive mixer circuitry includes a mixer and a local oscillator. The local oscillator generates oscillator output signals to control one or more switches in the mixer. The passive mixer circuitry may be provided with an oscillator phase noise cancelling component configured to cancel the phase noise that can coupled to the input of the mixer via parasitics. The oscillator phase noise cancelling component can be a capacitor structure configured to receive inverted oscillator output signals. Arranged and operated in this way, the passive mixer circuitry can generate baseband signals with improved noise figure performance.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.). MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 24 may include wireless communications circuitry such as wireless communications circuitry 34 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include baseband processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands." and may span corresponding ranges of frequencies. In general, the radio-frequency transceiver circuitry within wireless circuitry 24 may cover (handle) any desired frequency bands of interest.

Figure 2:
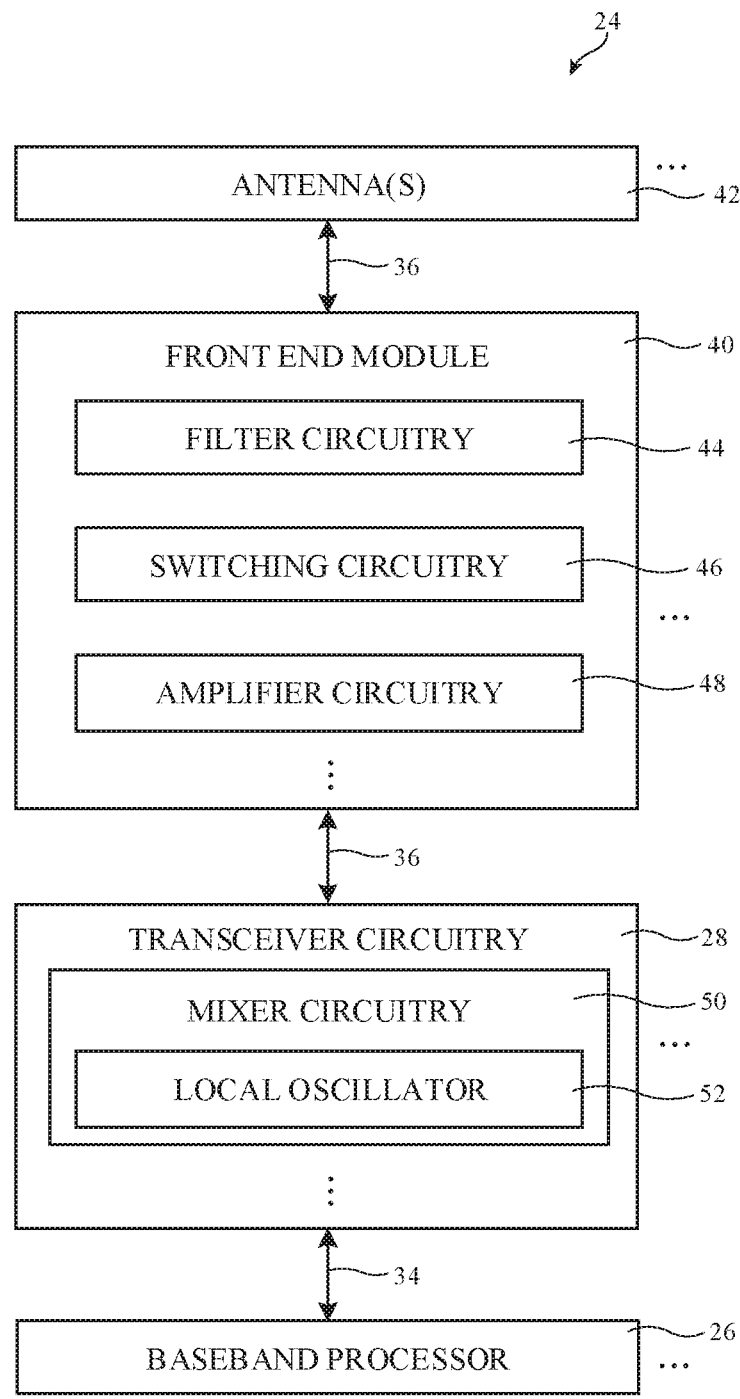
FIG. 2 is a diagram of illustrative wireless communications circuitry having transceiver circuitry in accordance with some embodiments.

FIG. 2 is a diagram showing illustrative components within wireless circuitry 24. As shown in FIG. 2, wireless circuitry 24 may include a baseband processor such as baseband processor 26, radio-frequency (RF) transceiver circuitry such as radio-frequency transceiver 28, radio-frequency front end circuitry such as radio-frequency front end module (FEM) 40, and antenna(s) 42. Baseband processor 26 may be coupled to transceiver 28 over baseband path 34. Transceiver 28 may be coupled to antenna 42 via radio-frequency transmission line path 36. Radio-frequency front end module 40 may be interposed on radio-frequency transmission line path 36 between transceiver 28 and antenna 42.

In the example of FIG. 2, wireless circuitry 24 is illustrated as including only a single baseband processor 26, a single transceiver 28, a single front end module 40, and a single antenna 42 for the sake of clarity. In general, wireless circuitry 24 may include any desired number of baseband processors 26, any desired number of transceivers 36, any desired number of front end modules 40, and any desired number of antennas 42. Each baseband processor 26 may be coupled to one or more transceiver 28 over respective baseband paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 interposed thereon. If desired, two or more front end modules 40 may be interposed on the same radio-frequency transmission line path 36. If desired, one or more of the radio-frequency transmission line paths 36 in wireless circuitry 24 may be implemented without any front end module interposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

In performing wireless transmission, baseband processor 26 may provide baseband signals to transceiver 28 over baseband path 34. Transceiver 28 may further include circuitry for converting the baseband signals received from baseband processor 26 into corresponding radio-frequency signals. For example, transceiver circuitry 28 may include mixer circuitry 50 for up-converting (or modulating) the baseband signals to radio-frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding baseband signals. For example, transceiver 28 may use mixer circuitry 50 for down-converting (or demodulating) the received radio-frequency signals to baseband frequencies prior to conveying the received signals to baseband processor 26 over baseband path 34. Mixer circuitry 50 can include oscillator circuitry such as a local oscillator 52. Local oscillator 52 can generate oscillator signals that mixer circuitry 50 uses to modulate transmitting signals from baseband frequencies to radio frequencies and/or to demodulate the received signals from radio frequencies to baseband frequencies.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband processor 26 and/or portions of transceiver 28 (e.g., a host processor on transceiver 28) may form a part of control circuitry 14. Control circuitry 14 (e.g., portions of control circuitry 14 formed on baseband processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Figure 3:
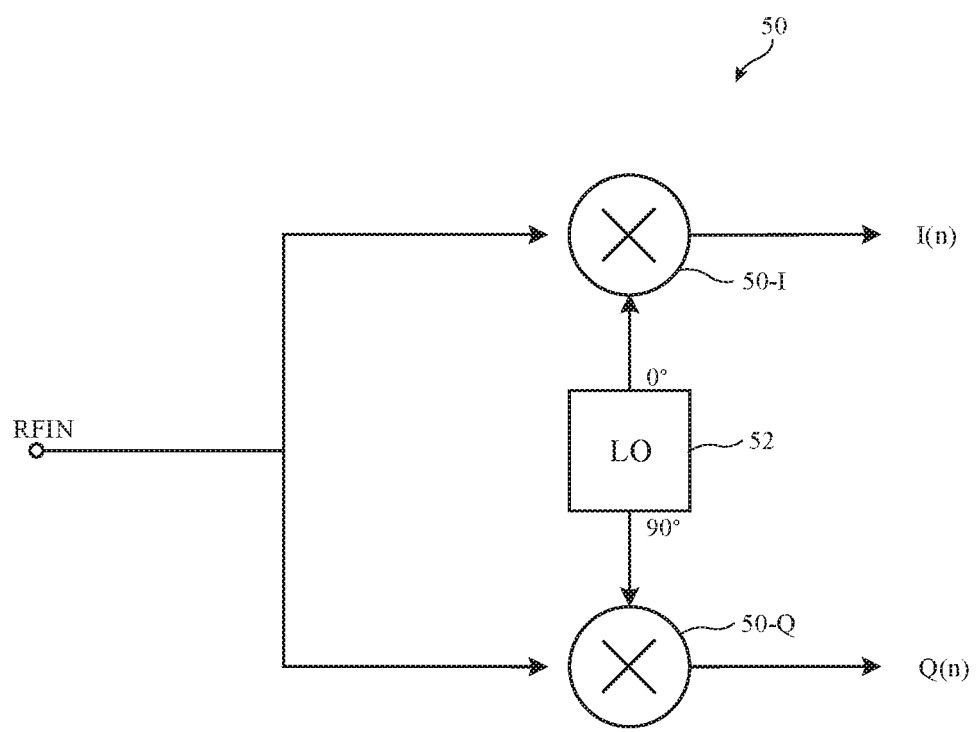
FIG. 3 is a diagram of illustrative mixer circuitry in accordance with some embodiments.

As described above, mixer circuitry 50 can be used to down-convert radio-frequency signals to baseband frequencies for demodulation. FIG. 3 is a diagram of illustrative mixer circuitry 50. As shown in FIG. 3, mixer circuitry 50 may include an input port RFIN, a first mixer portion 50-I, a second mixer portion 50-Q, and an associated local oscillator (LO) 52. Input port RFIN is configured to receive radio-frequency signals from front-end module 40. As an example, input port RFIN may be configured to receive radio-frequency from a low noise amplifier within front-end module 40. As another example, input port RFIN may be configured to receive radio-frequency signals from a balun. As another example, input port RFIN may be configured to receive radio-frequency signals from other front-end module components or directly from antenna 42.

Oscillator 52 may be configured to generate a first oscillator output signal and a second oscillator output signal that is phase shifted by 90° with respect to the first oscillator output signal. The first oscillator output signal is fed to first mixer portion 50-I. First mixer portion 50-I may mix the radio-frequency input signals received at input port RFIN with the first oscillator output signal to generate corresponding in-phase signals I(n). Second mixer portion 50-Q may mix the radio-frequency input signals received at the RFIN port with the second oscillator output signal to generate corresponding quadrature-phase signals Q(n). In-phase signals I(n) and quadrature-phase signals Q(n) may generated at the output of the mixer may collectively be referred to as baseband signals, which are then fed to baseband processor 26.

Figure 4:
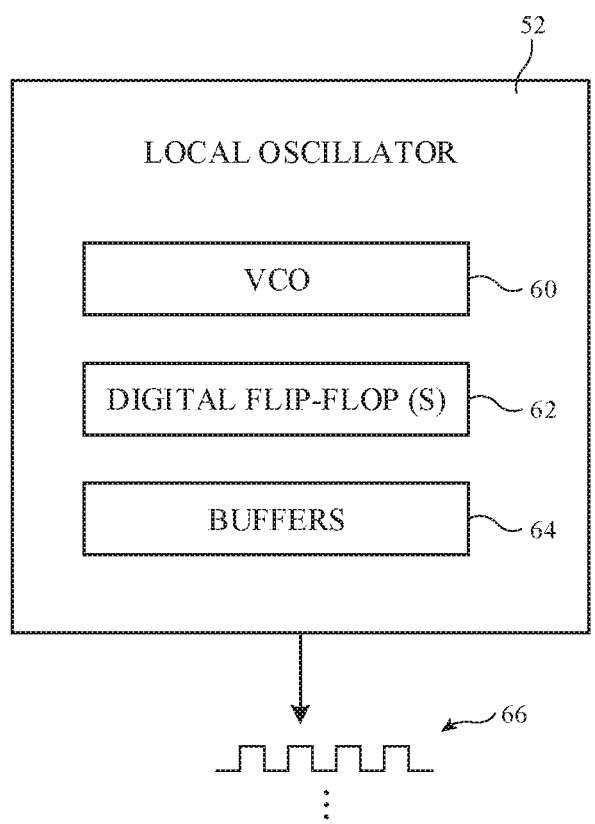
FIG. 4 is a diagram of an illustrative local oscillator in accordance with some embodiments.

FIG. 4 is a block diagram of local oscillator 52. As shown in FIG. 4, oscillator 52 may include a voltage controlled oscillator such as voltage controlled oscillator (VCO) 60, one or more digital flip-flops such as digital flip-flops 62, and associated buffer circuits such as buffers 64. Voltage controlled oscillator 60 can output a periodic signal to control digital flip-flops 62. Flip-flops 62 can be any latch-based digital circuit for generating clock signals based on the periodic signal provided by voltage controlled oscillator 60. The clock signals generated by flip-flops 62 may be fed through respective chains of buffer circuits 64 to generate one or more oscillator output signals 66.

As shown in the example of FIG. 3, oscillator 52 can generate at least two different oscillator output signals with different phases (see, e.g., a 0° LO phase signal and a 90° LO phase signal). As another example, oscillator 52 may generate at least four different oscillator output signals (e.g., a 0° LO phase signal, a 90° LO phase signal, a 180° LO phase signal, and a 270° LO phase signal). In general, oscillator 52 may generate any suitable number of LO phases (e.g., two or more LO phases, three or more LO phases, more than four LO phases, four to ten LO phases, more than ten LO phases, etc.). In practice, digital flip-flops 62 and buffer circuits 64 are susceptible to rise and fall time variations, random phase shift and signal jitter, which can all contribute to random phase noise that can be introduced by the local oscillator to degrade the noise figure performance of the overall mixer circuitry.

Mixer circuitry 50 may be an active mixer or a passive mixer. Active mixers constantly consume power but can be used to provide gain. Passive mixers can also provide gain but can achieve improved linearity and consume less power than active mixers. Conventional passive mixers can suffer from noise figure degradation due to phase noise associated with the local oscillator (e.g., due to noise associated with the digital flip-flop and buffer circuits when generating the various LO phases). If care is not taken, the different oscillator signals generated by the local oscillator can couple to the input port of the passive mixer through parasitics, which can then self-mix with the local oscillator frequency. This undesired coupling of the local oscillator signals (sometimes times referred to herein as a local oscillator phase noise, oscillator phase noise, or LO phase noise) can result in noise degradation at baseband. This noise degradation is exacerbated at advance complementary metal-oxide-semiconductor (CMOS) processes, which are more susceptible to flicker noise.

Figure 5:
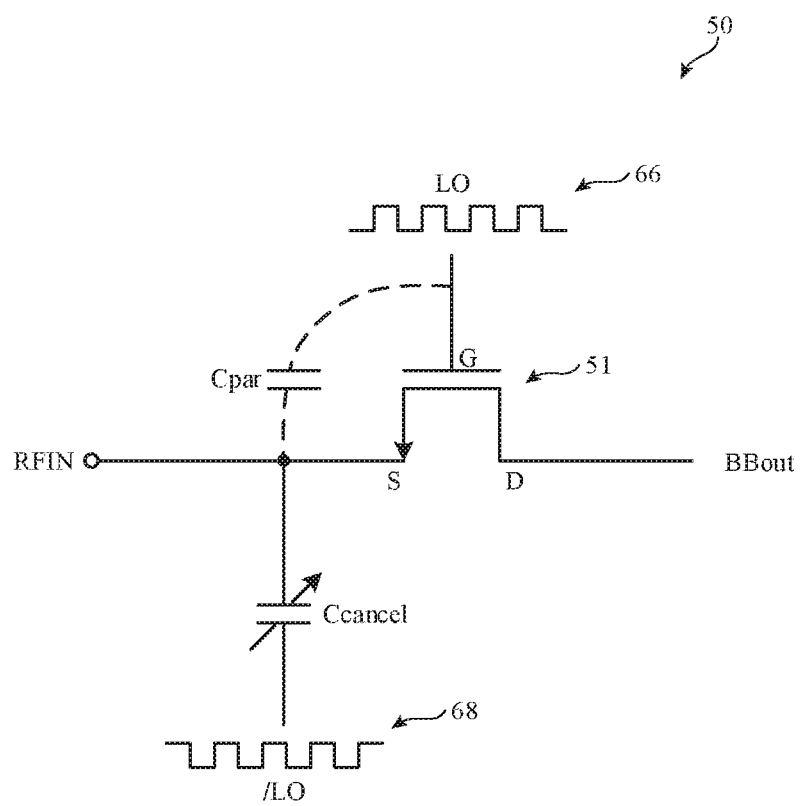
FIG. 5 is a diagram of an illustrative mixer switch coupled to an oscillator phase noise cancelling capacitor in accordance with some embodiments.

FIG. 5 is a diagram of illustrative passive mixer circuitry 50 provided with an oscillator phase noise cancelling component to cancel (compensate) LO phases that can inadvertently couple to the input port of the passive mixer. As shown in FIG. 5, mixer circuitry 50 may include at least one passive mixer switch such as switch 51. Switch 51 may, for example, be implemented as a transistor such as an n-channel metal-oxide-semiconductor (NMOS) transistor. This is merely illustrative. As another example, switch 51 may be implemented as a p-channel metal-oxide-semiconductor (PMOS) transistor. In general, any suitable type of semiconductor switching component may also be used. Configurations in which switch 51 is implemented as an NMOS transistor may sometimes be described herein as an example.

Switch 51 may have an input terminal (e.g., a transistor source terminal) coupled to the mixer input port RFIN. Switch 51 may have an output terminal (e.g., a transistor drain terminal) coupled to the mixer output port BBout. Baseband signals may be provided at mixer output port BBout. Switch 51 may further include a control terminal (e.g., a transistor gate terminal) configured to receive an oscillator signal 66 generated by oscillator 52. The terms "source" and "drain" terminals used to refer to current-conveying terminals in a transistor may be used interchangeably and are sometimes referred to as "source-drain" terminals. Thus, the arrangement of FIG. 5 can also be described as transistor 51 having a first source-drain terminal coupled to the RFIN port and a second source-drain terminal coupled to the BBout port.

As shown in FIG. 5, there may be parasitic components such as parasitic capacitance Cpar existing between the control (G) terminal and the input (S) terminal of switch 51. Parasitic capacitance Cpar can couple random noise sources associated with the LO signal 66 to input port RFIN, which can then self-mix with the LO frequency and can directly degrade the noise figure of the baseband signals generated at output port BBout.

To help compensate (mitigate) this undesired parasitic coupling effect, mixer circuitry 50 is provided with an oscillator phase noise cancelling capacitor Ccancel. Phase noise cancelling capacitor Ccancel has a first terminal coupled to mixer input port RFIN and a second terminal configured to receive an inverted oscillator signal 68. Signal 68 may be inverted with respect to signal 66 (e.g., signal 68 may be an inverted version of signal 66). Configured and operated in this way, any phase noise that is injected from the control (G) terminal of switch 51 into the RFIN node through parasitic capacitance Cpar can be offset or canceled by a corresponding compensation coupling signal that is simultaneously injected into the RFIN node as a result of controlling capacitor Ccancel using the inverted (opposite) oscillator signal 68. Thus, the phase noise coupled through Cpar associated with switch 51 will not translate to the baseband output port BBout. Capacitor Ccancel is therefore sometimes referred to as an oscillator phase noise canceling component, an oscillator phase noise canceller, an oscillator phase noise canceling circuit, an oscillator phase noise reduction circuit, an oscillator phase noise compensation circuit, or an oscillator phase noise mitigation circuit.

In some embodiments, oscillator phase noise canceling capacitor Ccancel has a fixed capacitance value. As another example, capacitor Ccancel may exhibit a variable capacitance that can be adjusted to tune a cancellation gain associated with capacitor Ccancel (e.g., to adjust the amount of LO phase noise cancellation provided by Ccancel). Capacitor Ccancel may be implemented as a capacitor bank (e.g., an array or capacitors at least some of which can be switched into use depending on the desired capacitance value).

Figure 6:
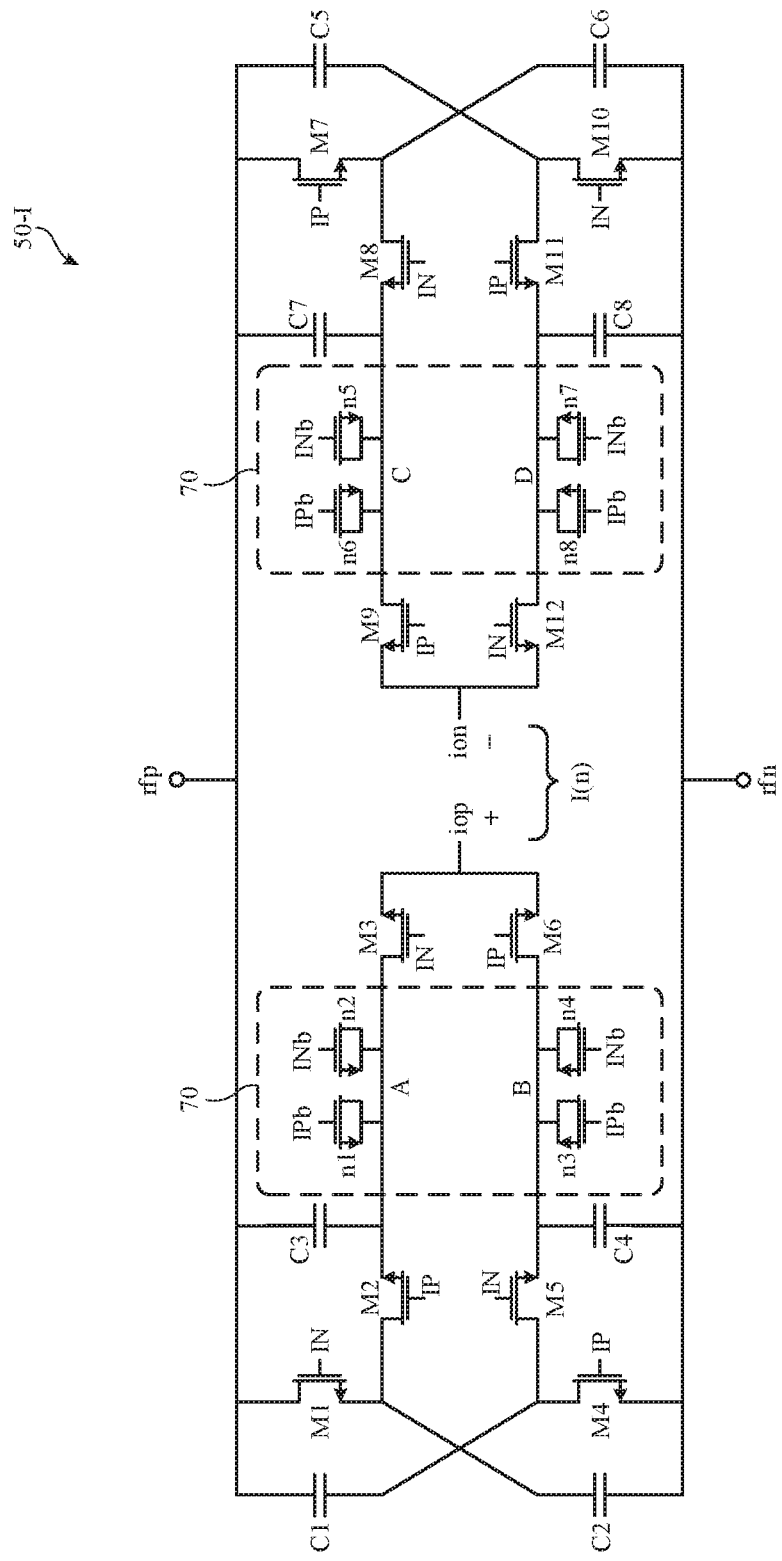
FIG. 6 is a circuit diagram of a portion of mixer circuitry configured to generate in-phase output signals in accordance with some embodiments.

FIG. 6 is a circuit diagram of first mixer portion 50-I formed as a passive differential mixer. As shown in FIG. 6, first mixer portion 50-I may have a differential input port with a positive input port rfp and a negative input port rfn. Differential input ports rfp and rfn may collectively represent mixer input port RFIN shown in FIGS. 3 and 5. Mixer portion 50-I may have a differential output port with a positive output port iop and a negative output port ion. In-phase signals I(n) may be generated across differential output ports iop and ion.

Mixer portion 50-I may further include switches M1-M12 and capacitors C1-C8. In the example of FIG. 6, switches M-M12 are implemented as n-channel transistors (e.g., NMOS transistors). This is merely illustrative. In other embodiments, at least some of the switches or all of the switches in mixer portion 50-I may be implemented as p-channel transistors (e.g., PMOS transistors).

Transistors M1, M2, and M3 may be coupled in series between positive input port rfp and positive output port iop. Transistor M1 has a gate (control) terminal configured to receive oscillator signal IN. Transistor M2 has a gate (control) terminal configured to receive oscillator signal IP. Transistor M3 has a gate (control) terminal configured to receive oscillator signal IN. Signals IP and IN are generated by local oscillator 52 and are described in detail below in connection with FIGS. 8 and 9. Capacitor C1 has a first terminal coupled to positive input port rfp and a second terminal coupled to a node interposed between the source-drain terminals of transistors M4 and M5. Capacitor C3 has a first terminal coupled to positive input port rfp and a second terminal coupled to node A interposed between the source-drain terminals of transistors M2 and M3.

Transistors M4, M5, and M6 may be coupled in series between negative input port rfn and positive output port iop. Transistor M4 has a gate (control) terminal configured to receive oscillator signal IP. Transistor M5 has a gate (control) terminal configured to receive oscillator signal IN. Transistor M6 has a gate (control) terminal configured to receive oscillator signal IP. Capacitor C2 has a first terminal coupled to negative input port rfn and a second terminal coupled to a node interposed between the source-drain terminals of transistors M1 and M2. Capacitor C4 has a first terminal coupled to negative input port rfn and a second terminal coupled to node B interposed between the source-drain terminals of transistors M5 and M6.

The phase noise associated with oscillator signal IP may be coupled to node A via the parasitic capacitance of transistor M2. Similarly, the phase noise associated with oscillator signal IN may also be coupled to node A via the parasitic capacitance of transistor M3. The phase noise coupled to node A can then mix with oscillator signal IN through transistor M3, which results in noise degradation in the baseband output signals. To cancel the LO phase noise associated with signals IP and IN, mixer portion 50-I is provided with capacitors n1 and n2 that re coupled to node A. In the example of FIG. 6, capacitors n1 and n2 are implemented as metal-oxide-semiconductor capacitors (MOSCAPs). This is merely illustrative. As another example, capacitors n1 and n2 can be implemented as metal-insulator-metal (MIM) capacitors. As another example, capacitors n1 and n2 can be implemented as metal-oxide-metal (MOM) capacitors. In general, capacitors n1 and n2 can be implemented using any suitable semiconductor capacitor structure.

Capacitor n1 has a first (body) terminal coupled to node A and a second (gate) terminal configured to receive oscillator signal IPb (e.g., a signal that is inverted with respect to signal IP). Capacitor n2 has a first (body) terminal coupled to node A and a second (gate) terminal configured to receive oscillator signal INb (e.g., a signal that is inverted with respect to signal IN). By connecting capacitor n1 to the source-drain (output) terminal of transistor M2 and modulating capacitor n1 using the opposite (inverted) LO phase IPb, any phase noise coupling to node A through the parasitic capacitance of transistor M2 can be canceled by an equal and opposite coupling effect from capacitor nL. The other source-drain (input) terminal of transistor M2 is directly connected to transistor M1. Similarly, by connecting capacitor n2 to the source-drain (input) terminal of transistor M3 and modulating capacitor n2 using the opposite (inverted) LO phase INb, any phase noise coupling to node A through the parasitic capacitance of transistor M3 can be canceled by an equal and opposite coupling effect from capacitor n2. The other source-drain (output) terminal of transistor M3 is connected to positive output port iop.

Mixer portion 50-I may also be provided with capacitors n3 and n4 that re coupled to node B. In the example of FIG. 6, capacitors n3 and n4 are implemented as metal-oxide-semiconductor capacitors (MOSCAPs), which is merely illustrative. If desired, capacitors n3 and n4 can be implemented as metal-insulator-metal (MIM) capacitors, metal-oxide-metal (MOM) capacitors, or any suitable semiconductor capacitor structure.

Capacitor n3 has a first (body) terminal coupled to node B and a second (gate) terminal configured to receive oscillator signal IPb (e.g., a signal that is inverted with respect to signal IP). Capacitor n4 has a first (body) terminal coupled to node B and a second (gate) terminal configured to receive oscillator signal INb (e.g., a signal that is inverted with respect to signal IN). By connecting capacitor n4 to the source-drain (output) terminal of transistor M5 and modulating capacitor n4 using the opposite (inverted) LO phase INb, any phase noise coupling to node B through the parasitic capacitance of transistor M5 can be canceled by an equal and opposite coupling effect from capacitor n4. Similarly, by connecting capacitor n3 to the source-drain (input) terminal of transistor M6 and modulating capacitor n3 using the opposite (inverted) LO phase IPb, any phase noise coupling to node B through the parasitic capacitance of transistor M6 can be canceled by an equal and opposite coupling effect from capacitor n3.

Capacitors n1, n2, n3, and n4 that are used to cancel out the LO phase noise may be referred to collectively as oscillator phase noise cancellation circuitry 70. Each of capacitors n1-n4 may be referred to as an oscillator phase noise cancellation capacitor, oscillator phase noise compensation capacitor, oscillator phase noise cancellation component, or oscillator phase noise cancellation circuit.

In a single-ended approach, passive in-phase mixer portion 50-I may include only components M1-M6, C-C4, and n1-n4 connected in the way described above. In a differential signaling scheme, mixer portion 50-I may include another half circuit for generating signals at negative output port ion (see, e.g., transistors M7-M12, C5-C8, and n5-n8).

Transistors M7, M8, and M9 may be coupled in series between positive input port rfp and negative output port ion. Transistor M7 has a gate (control) terminal configured to receive oscillator signal IP. Transistor M8 has a gate (control) terminal configured to receive oscillator signal IN. Transistor M9 has a gate (control) terminal configured to receive oscillator signal IP. Capacitor C5 has a first terminal coupled to positive input port rfp and a second terminal coupled to a node interposed between the source-drain terminals of transistors M10 and M11. Capacitor C7 has a first terminal coupled to positive input port rfp and a second terminal coupled to node C interposed between the source-drain terminals of transistors M8 and M9.

Transistors M10, M11, and M12 may be coupled in series between negative input port rfn and negative output port ion. Transistor M10 has a gate (control) terminal configured to receive oscillator signal IN. Transistor M11 has a gate (control) terminal configured to receive oscillator signal IP. Transistor M12 has a gate (control) terminal configured to receive oscillator signal IN. Capacitor C6 has a first terminal coupled to negative input port rfn and a second terminal coupled to a node interposed between the source-drain terminals of transistors M7 and M8. Capacitor C8 has a first terminal coupled to negative input port rfn and a second terminal coupled to node D interposed between the source-drain terminals of transistors M11 and M12.

The phase noise associated with oscillator signal IN may be coupled to node C via the parasitic capacitance associated with transistor M8. Similarly, the phase noise associated with oscillator signal IP may also be coupled to node C via the parasitic capacitance associated with transistor M9. The phase noise coupled to node C can then mix with oscillator signal IP through transistor M9, which results in noise degradation in the baseband output signals at output port ion.

Oscillator phase noise cancelling capacitors n5-n8 may be used to cancel the LO phase noise associated with signals IP and IN. In the example of FIG. 6, capacitors n5-n8 are implemented as metal-oxide-semiconductor capacitors (MOSCAPs), which is merely illustrative. As other examples, capacitors n5-n8 can be implemented as MIM capacitors, MOM capacitors, or other suitable semiconductor capacitor structures.

Capacitor n5 has a first (body) terminal coupled to node C and a second (gate) terminal configured to receive oscillator signal INb. Capacitor n6 has a first (body) terminal coupled to node C and a second (gate) terminal configured to receive oscillator signal IPb. By connecting capacitor n5 to the source-drain (output) terminal of transistor M8 and modulating capacitor n5 using the opposite (inverted) LO phase INb, any phase noise coupling to node C through the parasitic capacitance of transistor M8 can be canceled by an equal and opposite coupling effect from capacitor n5. The other source-drain (input) terminal of transistor M8 is directly connected to transistor M7. Similarly, by connecting capacitor n6 to the source-drain (input) terminal of transistor M9 and modulating capacitor n6 using the opposite (inverted) LO phase IPb, any phase noise coupling to node C through the parasitic capacitance of transistor M9 can be canceled by an equal and opposite coupling effect from capacitor n6. The other source-drain (output) terminal of transistor M9 is connected to negative output port ion.

Capacitor n7 has a first (body) terminal coupled to node D and a second (gate) terminal configured to receive oscillator signal INb. Capacitor n8 has a first (body) terminal coupled to node D and a second (gate) terminal configured to receive oscillator signal IPb. By connecting capacitor n8 to the source-drain (output) terminal of transistor M11 and modulating capacitor n8 using the opposite (inverted) LO phase IPb, any phase noise coupling to node D through the parasitic capacitance of transistor M11 can be canceled by an equal and opposite coupling effect from capacitor n8. Similarly, by connecting capacitor n7 to the source-drain (input) terminal of transistor M12 and modulating capacitor n7 using the opposite (inverted) LO phase INb, any phase noise coupling to node D through the parasitic capacitance of transistor M12 can be canceled by an equal and opposite coupling effect from capacitor n7.

Capacitors n5, n6, n7, and n8 that are used to cancel out the LO phase noise may also be considered to be part of oscillator phase noise cancellation circuitry 70. Each of capacitors n5-n8 may be referred to as an oscillator phase noise cancellation capacitor, oscillator phase noise compensation capacitor, oscillator phase noise cancellation component, or oscillator phase noise cancellation circuit.

The size of each oscillator phase noise cancellation capacitors n1-n8 may be carefully selected. Since capacitor n1 is configured to offset the coupling effects associated with the gate-to-source parasitic capacitance Cgs of transistor M2 (which represents only half of the parasitic capacitance at the gate terminal of M2), MOS capacitor n1 may be at least half the size of transistor M2 or otherwise suitably sized to match the Cgs of transistor M2. Similarly, since capacitor n2 is configured to offset the coupling effects associated with the gate-to-drain parasitic capacitance Cgd of transistor M3 (which represents only half of the parasitic capacitance at the gate terminal of M3), MOS capacitor n2 may be at least half the size of transistor M3 or otherwise suitably sized to match the Cgd of transistor M3. Likewise, capacitors n3, n4, n5, n6, n7, and n8 may be half the size of transistors M5, M6, M8, M9, M11, and M12, respectively.

The oscillator signals controlling some of the other switches can also couple to internal nodes A, B, C, and D. For instance, oscillator signal IN controlling the gate of transistor M1 might also be coupled to node A via capacitor C3. As another example, oscillator signal IN controlling the gate of transistor M5 might be coupled to node A via capacitors C1 and C3. As yet another example, oscillator signal IP controlling the gate of transistor M4 might be coupled to node A via capacitors C1 and C3. As another example, oscillator signal IP controlling the gate of transistor M7 might be coupled to node A via capacitor C3. As another example, oscillator signal IN controlling the gate of transistor M10 might be coupled to node A via capacitors C5 and C3. As another example, oscillator signal IP controlling the gate of transistor M11 might also be coupled to node A via capacitors C5 and C3. The sizes of LO phase noise cancelling capacitors n1 and n2 may be optimized to cancel the LO noise from all of these coupling paths. The size of capacitor n1 might be greater than half the size of M2 to help compensate for the additional parasitic coupling paths. Similarly, the size of capacitor n2 might be greater than half the size of M3 to help compensate for the additional parasitic coupling paths.

The example of FIG. 6 in which mixer portion 50-I includes 12 switches, 8 capacitors, and 8 LO phase noise cancellation capacitors is merely illustrative. In general, mixer portion 50-I may be any passive mixer circuitry that is configured to provide voltage gain and that includes any suitable number of components. As an example, mixer portion 50-I may include fewer than 12 switches, 1-11 switches, 2-10 switches, 3-9 switches, more than 12 switches, 12-20 switches, 13-19 switches, 14-18 switches, or more than 20 switches. As another example, mixer portion 50-I may include fewer than 8 capacitors, 1-7 capacitors, 2-6 capacitors, more than 8 capacitors, 8-16 capacitors, more than 10 capacitors. 10-20 capacitors, more than 20 capacitors, or no capacitors. As another example, mixer portion 50-I may include fewer than 8 phase noise cancellation capacitors, at least one phase noise cancellation capacitor, at least two phase noise cancellation capacitors, four or more phase noise cancellation capacitors, 1-7 phase noise cancellation capacitors, 2-6 phase noise cancellation capacitors, more than 8 phase noise cancellation capacitors, 8-16 phase noise cancellation capacitors, or more than 16 phase noise cancellation capacitors.

Figure 7:
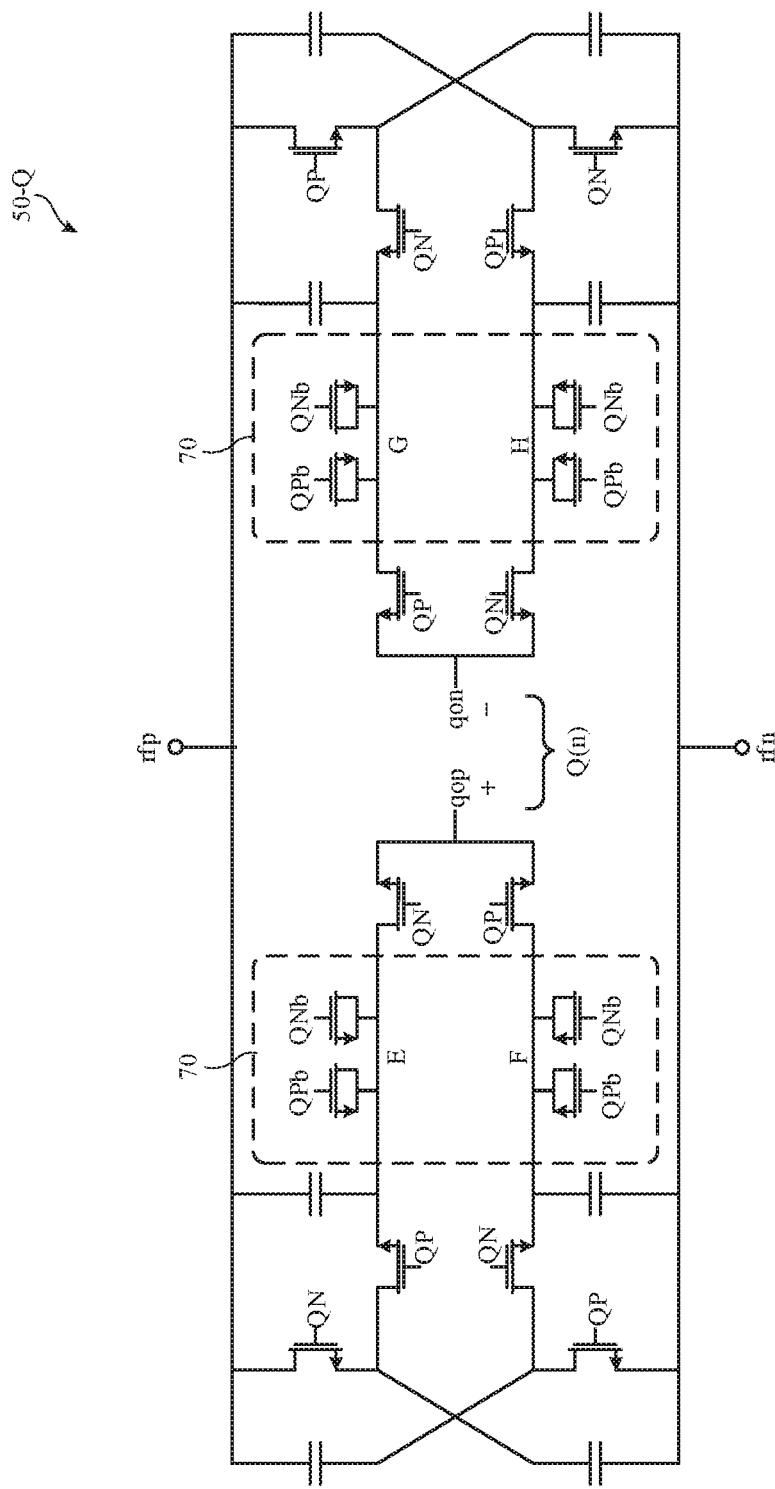
FIG. 7 is a circuit diagram of a portion of mixer circuitry configured to generate quadrature-phase output signals in accordance with some embodiments.

First mixer portion 50-I of FIG. 6 is used to generate the in-phase signals I(n). FIG. 7 is a circuit diagram of second mixer portion 50-Q that is used to generate the quadrature-phase signals Q(n). As shown in FIG. 7, second mixer portion 50-Q may have a differential input port with a positive input port rfp and a negative input port rfn. Differential input ports rfp and rfn may collectively represent mixer input port RFIN shown in FIGS. 3 and 5. Mixer portion 50-Q may have a differential output port with a positive output port qop and a negative output port qon. Quadrature-phase signals Q(n) may be generated across differential output ports qop and qon.

Mixer portion 50-Q may include switches, capacitors, and LO phase noise canceling circuitry 70. The structure and connection of the switches, capacitors, and circuitry 70 in mixer portion 50-Q may be similar to that of mixer portion 50-I and need not be reiterated in detail to avoid obscuring the present embodiments. The mixer switches may be controlled by oscillator signals QN and QP. To help mitigate the LO phase noise associated with signals QN and QP coupling to internal nodes E, F, G, and H within mixer portion 50-Q, oscillator phase noise cancellation capacitors 70 are directly connected to internal nodes E, F, G. and H and are modulated by inverted oscillator signals QPb and QNb to provide an equal and opposite coupling effect.

Figure 8:
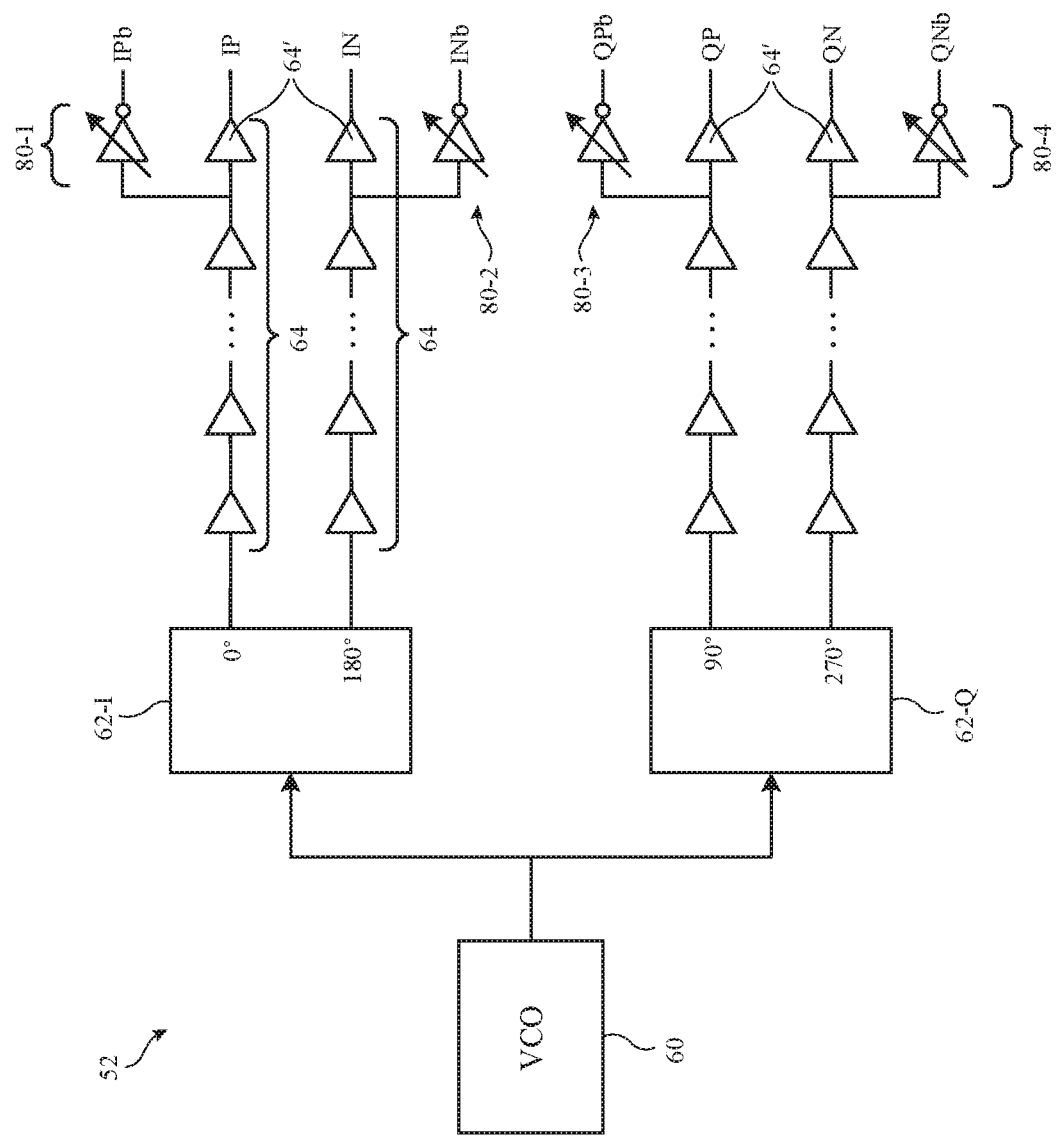
FIG. 8 is a circuit diagram of an illustrative local oscillator configured to generate oscillator signals for controlling the mixer circuitry in accordance with some embodiments.

FIG. 8 is a circuit diagram of local oscillator 52 configured to generate the oscillator signals IP, IPb, IN, INb for controlling in-phase mixer portion 50-I and signals QP, QPb, QN, QNb for controlling quadrature-phase mixer portion 50-Q. As shown in FIG. 8, oscillator 52 uses voltage-controlled oscillator 60 to generate a periodic signal (e.g., a clock signal, square wave, or sinusoidal signal). The periodic signal generated by voltage-controlled oscillator 60 is fed to clock inputs of digital flip-flops 62-I and 62-Q. Flip-flop 62-I has a first output at which a first oscillator signal is generated and a second output at which a second oscillator signal is generated. The second oscillator signal may be 180° phase shifted with respect to the first oscillator signal. The first oscillator signal may be fed through a first chain of buffers 64 to generate corresponding oscillator output signal IP. The second oscillator signal may be fed through a second chain of buffers 64 to generate corresponding oscillator output signal IN.

Oscillator 52 may further include an inverting buffer such as inverter 80-1 that is coupled to the input of the final buffer stage 64' in the first chain of buffers. In other words, inverter 80-1 receives signals from the penultimate buffer in the first chain of buffers. Inverter 80-1 is used to generate oscillator output signal IPb, which is inverted with respect of signal IP. By coupling inverter 80-1 to only the final buffer stage 64', any potential noise contribution arising from the uncommon inverter path is minimized.

Oscillator 52 may further include an inverting buffer such as inverter 80-2 that is coupled to the input of the final buffer stage 64' in the second chain of buffers. In other words, inverter 80-2 receives signals from the penultimate buffer (i.e., from the buffer immediately preceding the final buffer stage 64') in the second chain of buffers. Inverter 80-2 is used to generate oscillator output signal INb, which is inverted with respect of signal IN. By coupling inverter 80-2 to only the final buffer stage 64', any potential noise contribution arising from the uncommon inverter path is minimized.

Flip-flop 62-Q has a first output at which a third oscillator signal is generated and a second output at which a fourth oscillator signal is generated. The third oscillator signal may be 90° phase shifted with respect to the first oscillator signal. The third oscillator signal may be fed through a third chain of buffers 64 to generate corresponding oscillator output signal QP. The fourth oscillator signal may be fed through a fourth chain of buffers 64 to generate corresponding oscillator output signal QN.

Oscillator 52 may further include an inverting buffer such as inverter 80-3 that is coupled to the input of the final buffer stage 64' in the third chain of buffers. In other words, inverter 80-3 receives signals from the penultimate buffer in the third chain of buffers. Inverter 80-3 is used to generate oscillator output signal QPb, which is inverted with respect of signal QP. By coupling inverter 80-3 to only the final buffer stage 64', any potential noise contribution arising from the uncommon inverter path is minimized.

Oscillator 52 may further include an inverting buffer such as inverter 80-4 that is coupled to the input of the final buffer stage 64' in the fourth chain of buffers. In other words, inverter 80-4 receives signals from the penultimate buffer in the fourth chain of buffers. Inverter 80-4 is used to generate oscillator output signal QNb, which is inverted with respect of signal QN. By coupling inverter 80-4 to only the final buffer stage 64', any potential noise contribution arising from the uncommon inverter path is minimized.

In some embodiments, inverters 80-1, 80-2, 80-3, and 80-4 may be programmable inverters with an adjustable delay. The delay of these inverters may be statically adjusted during calibration operations or dynamically adjusted during normal wireless operation to compensate for potential process, voltage, and temperature (PVT) variations.

Figure 9:
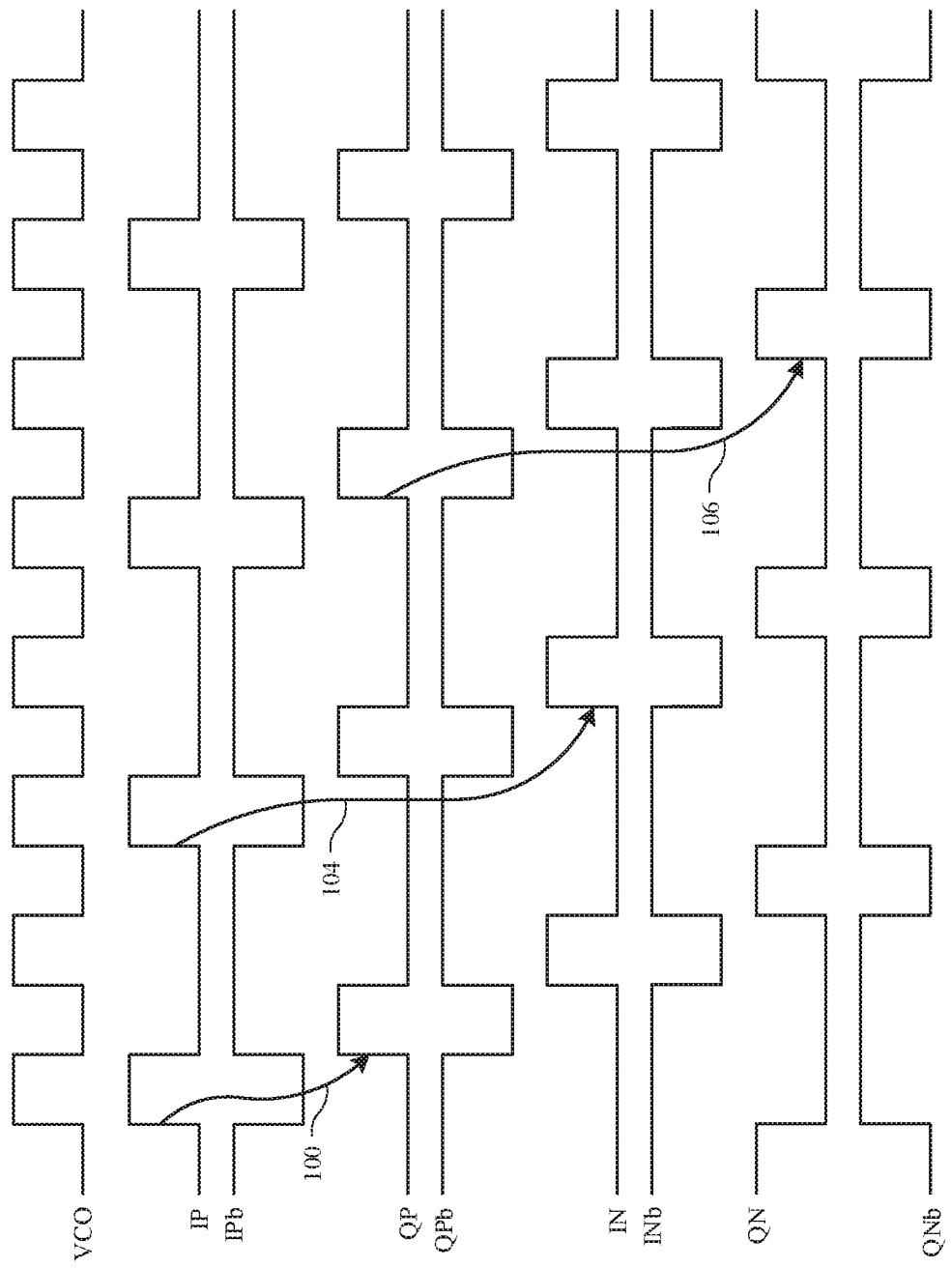
FIG. 9 is a diagram showing illustrative oscillator signal waveforms in accordance with some embodiments.

FIG. 9 is a diagram showing illustrative signal waveforms involved in the operation of local oscillator 52. As shown in FIG. 9, the VCO output may serve as the base clock signal. Although the VCO waveform is shown as a digital square wave, the VCO waveform can be an analog oscillating signal, a sinusoidal signal, or other periodic waveform. Oscillator signal IP may be aligned to the rising edge of VCO (e.g., with a 0° phase offset). Signal IP may (for example) be fed to the control/gate terminal of mixer switches M2, M4, M6, M7, M9, and M11 of FIG. 6. Oscillator signal IPb may be inverted with respect to signal IP and may therefore sometime be referred to as inverted oscillator signal IPb. Inverted signal IPb may (for example) be fed to oscillator phase noise cancelling circuits n1, n3, n6, and n8 in FIG. 6.

Oscillator signal IN may be offset by a 180° phase shift with respect to signal IP, as indicated by arrow 104. Signal IN may (for example) be fed to the control/gate terminal of mixer switches M1, M3, M5, M8, M10, and M12 of FIG. 6. Oscillator signal INb may be inverted with respect to signal IN and may therefore sometime be referred to as inverted oscillator signal INb. Inverted signal INb may (for example) be fed to oscillator phase noise cancelling circuits n2, n4, n5, and n7 in FIG. 6.

Oscillator signal QP may be offset by a 90° phase shift with respect to signal IP, as indicated by arrow 100. Signal QP may (for example) be fed to the control/gate terminal of corresponding mixer switches in FIG. 7. Oscillator signal QPb may be inverted with respect to signal QP and may therefore sometime be referred to as inverted oscillator signal QPb. Inverted signal QPb may (for example) be fed to corresponding oscillator phase noise cancelling MOSCAPs in FIG. 7. Oscillator signal QN may be offset by a 180° phase shift with respect to signal IN, as indicated by arrow 106. Signal QN may (for example) be fed to the control/gate terminal of corresponding mixer switches in FIG. 7. Oscillator signal QNb may be inverted with respect to signal QN and may therefore sometime be referred to as inverted oscillator signal QNb. Inverted signal QNb may (for example) be fed to corresponding oscillator phase noise cancelling capacitors in FIG. 7.

The example of FIG. 9 in which the oscillator signals IP, IPb, QP, QPb, IN, INb, QN, and QNb have a 25% duty cycle is merely illustrative. As another example, the oscillator signals may have a 50% duty cycle. As another example, the oscillator signals may have a 10% duty cycle. As another example, the oscillator signals may have a 20% duty cycle. As another example, the oscillator signals may have a 30% duty cycle. As another example, the oscillator signals may have a 40% duty cycle. As another example, the oscillator signals may have a 10-50% duty cycle. As another example, the oscillator signals may have a duty cycle greater than 50%. As another example, the oscillator signals may have a 60% duty cycle. As another example, the oscillator signals may have a 50-90% duty cycle. If desired, the duty cycle of the oscillator signals may be adjustable.

Figure 10:
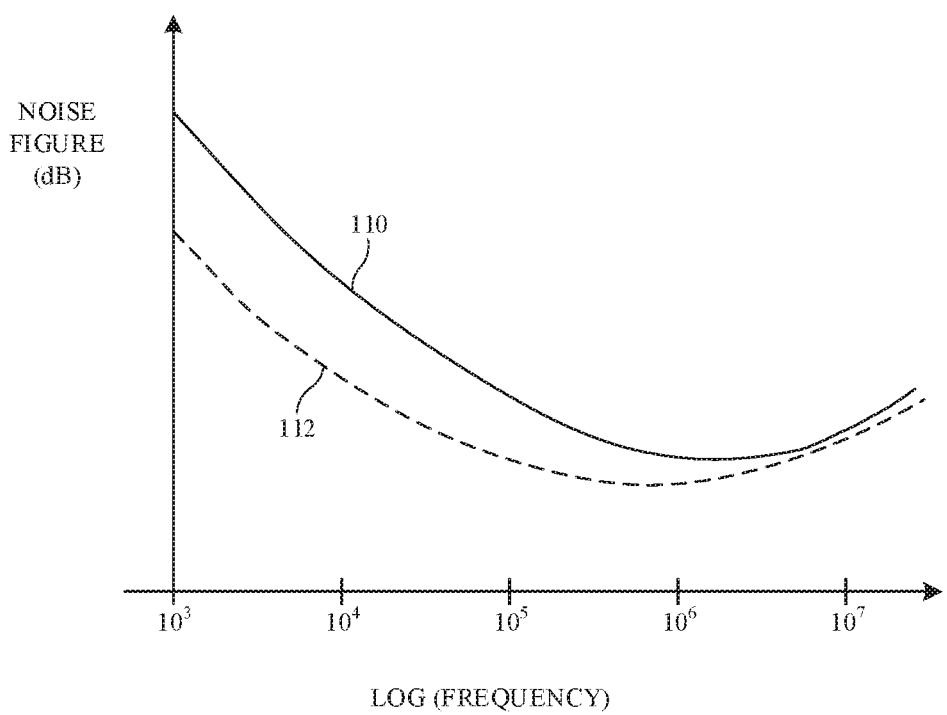
FIG. 10 is a diagram showing how performing oscillator phase noise cancellation can reduce noise figure in accordance with some embodiments.

FIG. 10 is a diagram showing how performing oscillator phase noise cancellation can reduce noise figure for the baseband signals. Curve 110 plots the noise figure for signals output by the passive mixer circuitry as a function of frequency (in log scale) without using the oscillator phase noise cancellation circuitry. Curve 112 plots the noise figure for signals output from the passive mixer circuitry as a function of frequency when the oscillator phase noise cancellation circuitry is enabled. As shown in FIG. 10, using the oscillator phase noise cancellation circuitry can help reduce the noise figure across a wide range of operating frequencies.

Figure 11:
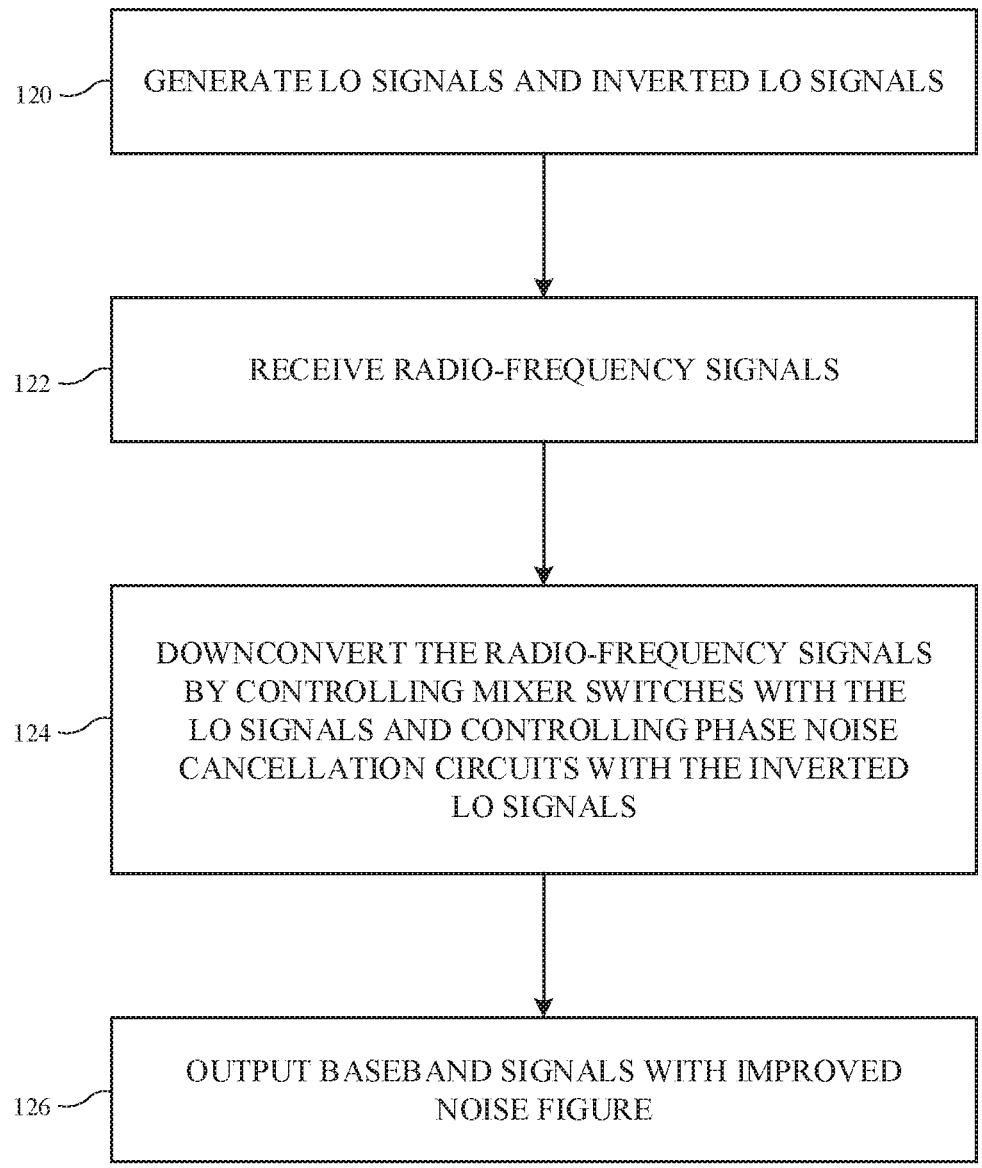
FIG. 11 is a flow chart of illustrative steps involved in operating mixer circuitry of the type shown in FIGS. 2-8 in accordance with some embodiments.

FIG. 11 is a flow chart of illustrative steps involved in operating mixer circuitry of the type shown in at least FIGS. 2-8. At step 120, a local oscillator (e.g., oscillator 52) generates oscillator signals and inverted oscillator signals. The oscillator signals may include signals IP, QP, IN, and QN, whereas the inverted oscillator signals may include signals IPb, QPb, INb, and QNb. Signals IP, QP, IN, QN, IPb, QPb, INb, and QNb may all be generated on different oscillator output terminals.

At step 122, the mixer circuitry may receive radio-frequency signals from the antenna or other circuitry within the front-end module (see FIG. 2).

At step 124, the mixer circuitry may down-convert the radio-frequency signals by controlling the mixer switches with the oscillator signals while controlling the phase noise cancellation circuitry (see, e.g., capacitor Ccancel in FIG. 5 and circuitry 70 in FIGS. 6-7) with the inverted oscillator signals. Modulating the LO phase noise cancellation circuitry using the inverted LO signals can help offset or compensate the parasitic coupling of the non-inverted LO signals into internal nodes within the mixer circuitry. This can help improve the noise figure performance of the mixer circuitry.

At step 126, the mixer circuitry can then output corresponding baseband signals to one or more baseband processors.

These steps are merely illustrative. At least some of the described steps may be modified or omitted; some of the described steps may be performed in parallel; additional steps may be added or inserted between the described steps; the order of certain steps may be reversed or altered; the timing of the described steps may be adjusted so that they occur at slightly different times, or the described steps may be distributed in a system.

The methods and operations described above in connection with FIGS. 1-11 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Mixer circuitry comprising:
    an input port configured to receive a radio-frequency signal;
    an output port on which a baseband signal is generated based on the radio-frequency signal;
    an oscillator having a first oscillator output terminal on which a first oscillator signal is generated, a second oscillator output terminal on which a second oscillator signal different than the first oscillator signal is generated, and a third oscillator output terminal on which a third oscillator signal that is inverted with respect to the second oscillator signal is generated;
    a first switch having an input terminal coupled to the input port, an output terminal coupled to the output port, and a control terminal coupled to the first oscillator output terminal;
    a second switch having an input terminal coupled to the output terminal of the first switch, an output terminal coupled to the output port, and a control terminal coupled to the second oscillator output terminal; and
    an oscillator phase noise cancellation capacitor having a first terminal coupled to the input terminal of the second switch and a second terminal coupled to the third oscillator output terminal.

2. The mixer circuitry of claim 1, the oscillator having a fourth oscillator output terminal on which a fourth oscillator signal that is inverted with respect to the first oscillator signal is generated, the mixer circuitry further comprising:
    an additional oscillator phase noise cancellation capacitor having a first terminal coupled to the input terminal of the second switch and a second terminal coupled to the fourth oscillator output terminal.

3. The mixer circuitry of claim 2, wherein the oscillator phase noise cancellation capacitor comprises a metal-oxide-semiconductor capacitor having a body terminal coupled to the input terminal of the second switch and a gate terminal coupled to the third oscillator output terminal.

4. The mixer circuitry of claim 2, wherein the oscillator phase noise cancellation capacitor comprises a metal-insulator-metal capacitor or a metal-oxide-metal capacitor.

5. The mixer circuitry of claim 2, further comprising:
a third switch having an input terminal coupled to the input port, an output terminal coupled to the input terminal of the first switch, and a control terminal coupled to the second oscillator output terminal.

6. The mixer circuitry of claim 2, wherein the oscillator comprises:
a flip-flop having a first output terminal and a second output terminal;
a first chain of buffers having an input terminal coupled to the first output terminal and an output terminal on which the first oscillator signal is generated; and
a second chain of buffers having an input terminal coupled to the second output terminal and an output terminal on which the second oscillator signal is generated.

7. The mixer circuitry of claim 6, wherein the oscillator comprises:
a first inverter having an input terminal coupled to a final buffer in the first chain of buffers and an output terminal on which the fourth oscillator signal is generated; and
a second inverter having an input terminal coupled to a final buffer in the second chain of buffers and an output terminal on which the third oscillator signal is generated.

8. The mixer circuitry of claim 7, wherein the first and second inverters have adjustable delays to compensate for process, voltage, and temperature variations.

9. The mixer circuitry of claim 3, wherein the metal-oxide-semiconductor capacitor is at least half the size of the second switch.

10. The mixer circuitry of claim 9, wherein the metal-oxide-semiconductor capacitor is more than half the size of the second switch.

11. A method of operating a mixer, comprising:
with an input port, receiving a radio-frequency signal;
with an oscillator, generating a first oscillator signal, a second oscillator signal different than the first oscillator signal, and a third oscillator signal that is inverted with respect to the second oscillator signal;
with a first switch, receiving the radio-frequency signal from the input port and receiving the first oscillator signal;
with a second switch, receiving signals from the first switch, receiving the second oscillator signal, and generating a corresponding baseband signal based on the radio-frequency signal; and
with an oscillator phase noise canceller, receiving the third oscillator signal and reducing a phase noise associated with second oscillator signal.

12. The method of claim 11, further comprising:
with the oscillator, generating a fourth oscillator signal that is inverted with respect to the first oscillator signal; and
with an additional phase noise canceller, receiving the fourth oscillator signal and reducing a phase noise associated with the first oscillator signal.

13. The method of claim 12, wherein generating the first, second, third, and fourth oscillator signals comprises:

with a flip-flop, generating a first output signal and a second output signal;
with a first series of buffers, receiving the first output signal and generating the first oscillator signal; and
with a second series of buffers, receiving the second output signal and generating the second oscillator signal.

14. The method of claim 13, wherein generating the first, second, third, and fourth oscillator signals further comprises:
with a first inverter, receiving a signal from a penultimate buffer in the first series of buffers and generating the fourth oscillator signal; and
with a second inverter, receiving a signal from a penultimate buffer in the second series of buffers and generating the third oscillator signal.

15. The method of claim 14, further comprising:
tuning the oscillator phase noise canceller to adjust an amount of cancellation gain provided by the oscillator phase noise canceller; and
adjusting a delay of the first inverter or the second inverter to compensate for process, voltage, and temperature variations.

16. An electronic device comprising:
an antenna configured to receive radio-frequency signals;
a baseband processor configured to receive baseband signals generated based on the radio-frequency signals;
an oscillator having first oscillator output terminals on which oscillator signals are generated and second oscillator output terminals on which inverted oscillator signals that are inverted with respect to the oscillator signals are generated; and
a mixer configured to receive the radio-frequency signals from the antenna and configured to generate the baseband signals, the mixer having
transistors with gate terminals coupled to the first oscillator output terminals, and
capacitors with first terminals coupled to the transistors and second terminals coupled to the second oscillator output terminals.

17. The electronic device of claim 16, wherein the mixer has an input port and an output port, the transistors comprising:
a first transistor having a first source-drain terminal coupled to the input port, a second source-drain terminal coupled to the output port, and a gate terminal configured to receive a first of the oscillator signals; and
a second transistor having a first source-drain terminal coupled to second source-drain terminal of the first transistor, a second source-drain terminal coupled to the output port, and a gate terminal configured to receive a second of the oscillator signals.

18. The electronic device of claim 17, wherein the capacitors comprises:
a first capacitor having a first terminal directly connected to the first transistor and a second terminal configured to receive a first of the inverted oscillator signals; and
a second capacitor having a first terminal directly connected to the second transistor and a second terminal configured to receive a second of the inverted oscillator signals.

19. The electronic device of claim 16, wherein the oscillator comprises:
a flip-flop having a first output and a second output;
a first plurality of buffers coupled to the first output and configured to generate a first of the oscillator signals; and a second plurality of buffers coupled to the second output and configured to generate a second of the oscillator signals.

20. The electronic device of claim 19, wherein the oscillator comprises:
   a first inverter coupled to a final buffer in the first plurality of buffers, the first inverter configured to generate a first of inverted oscillator signals and having an adjustable delay; and
   a second inverter coupled to a final buffer in the second plurality of buffers, the second inverter configured to generate a second of inverted oscillator signals and having an adjustable delay.

\* \* \* \* \*